(12) United States Patent
Chakraborty et al.

(10) Patent No.: US 11,422,774 B2
(45) Date of Patent: Aug. 23, 2022

(54) MULTIPLY AND ACCUMULATE USING CURRENT DIVISION AND SWITCHING

(71) Applicant: International Business Machines Corporation, Armonk, NY (US)

(72) Inventors: Sudipto Chakraborty, Plano, TX (US); Rajiv Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 353 days.

(21) Appl. No.: 16/854,254

(22) Filed: Apr. 21, 2020

(65) Prior Publication Data

US 2021/0326112 A1 Oct. 21, 2021

(51) Int. Cl.
G06F 7/544 (2006.01)
H03M 1/74 (2006.01)
G11C 11/16 (2006.01)

(52) U.S. Cl.
CPC ........ G06F 7/5443 (2013.01); G11C 11/1673 (2013.01); G11C 11/1675 (2013.01); G11C 11/1693 (2013.01); G11C 11/1697 (2013.01); H03M 1/74 (2013.01)

(58) Field of Classification Search
CPC ........... G06F 7/5443; G06F 2207/4814; G11C 11/1673; G11C 11/1675; G11C 11/1693; G11C 11/1697; G11C 11/54; G11C 14/0081; H03M 1/74; H03M 1/742; G06N 3/0635; G06N 3/063
See application file for complete search history.

(56) References Cited

U.S. PATENT DOCUMENTS

| 5,554,987 A * | 9/1996 | Ooga ................... G06F 1/0356 341/147 |
| 9,729,254 B1 * | 8/2017 | Zhou ...................... H04B 1/109 |
| 2006/0067112 A1 | 3/2006 | Ferrant et al. |
| 2007/0189361 A1 * | 8/2007 | Sugiyama ............ H04B 1/7136 375/E1.034 |
| 2014/0016404 A1 | 1/2014 | Kiim et al. |

FOREIGN PATENT DOCUMENTS

WO 2018119153 A2 6/2018

OTHER PUBLICATIONS

M. Judy et al., "A Digitally Interfaced Analog Correlation Filter System for Object Tracking Applications," in IEEE Transactions on Circuits and Systems I: Regular Papers, vol. 65, No. 9, pp. 2764-2773, Sep. 2018, doi: 10.1109/TCSI.2018.2819962. (Year: 2018).*

* cited by examiner

*Primary Examiner* — Ajay Ojha
(74) *Attorney, Agent, or Firm* — Scully, Scott, Murphy & Presser, P.C.; Daniel P. Morris

(57) ABSTRACT

System and methods for implementing a multiply and accumulate (MAC) operation are described. In an example, a device can multiply an input digital signal with an input current to generate a current signal. The device can further divide the current signal into a plurality of currents. The device can further sample the plurality of currents sequentially using the same clock frequency. The device can further combine the plurality of sampled currents to generate an output current signal.

20 Claims, 7 Drawing Sheets

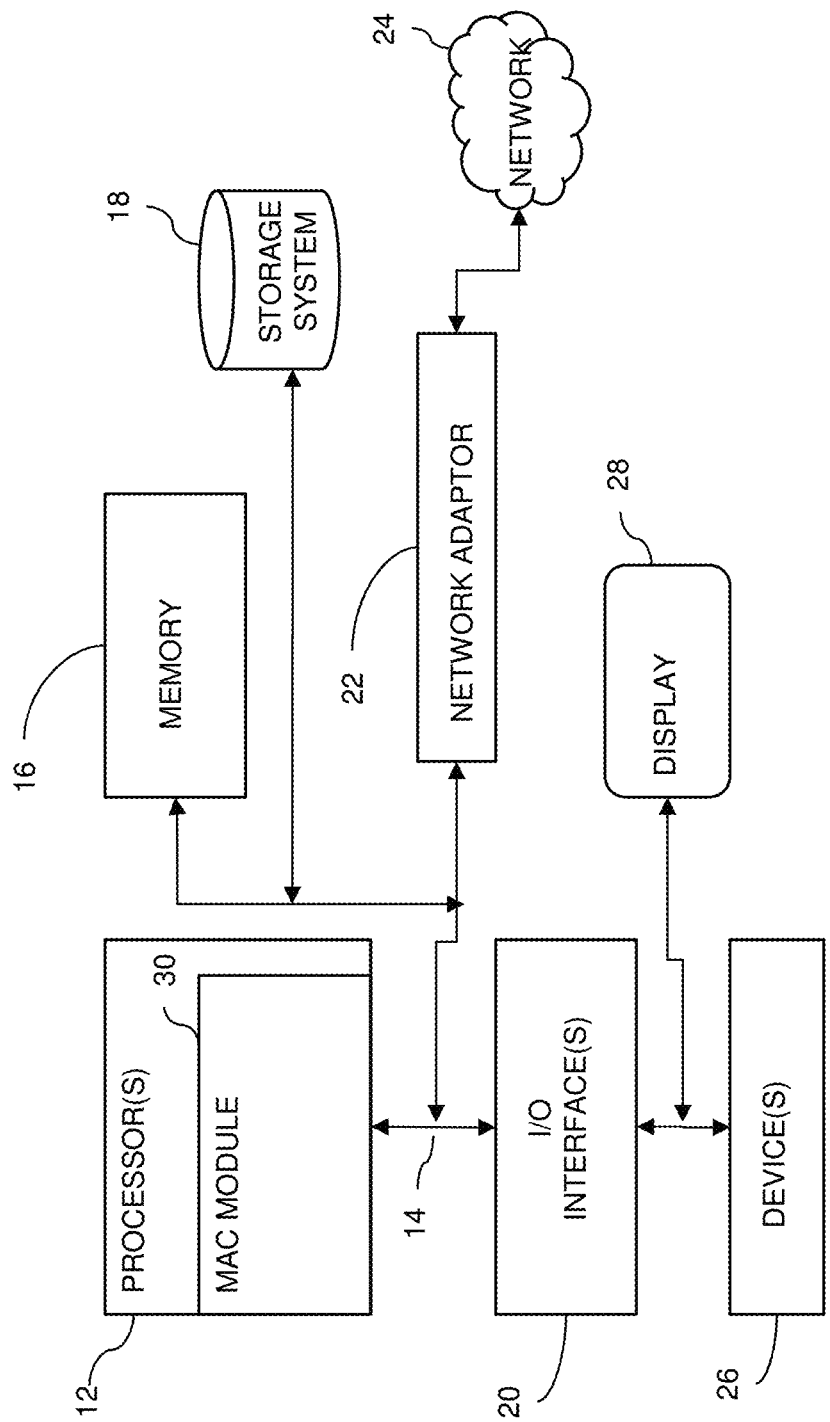

MULTIPLY AND ACCUMULATE USING CURRENT DIVISION AND SWITCHING

BACKGROUND

The present disclosure relates in general to hardware with analog-digital mixed mode architecture that can be implemented to perform various operations and algorithms.

In some examples, computer systems can include hardware that can be implemented to perform various operations, such as multiplication, addition, multiply and accumulate (MAC) operations, or other polynomial related operations. The inputs to such hardware can be in digital form, and the hardware can include digital-to-analog converters (DACs) configured to convert the inputs into analog signals for further processing. MACs can be implemented with filters, such as reconstruction filters, to counter aliasing that can be caused by the conversion process.

SUMMARY

In some examples, a device for implementing multiple and accumulate (MAC) operations is generally described. The device can include a current mode digital-to-analog converter (DAC) configured to multiply an input digital signal with an input current to generate a current signal. The device can further include a current divider coupled to the current mode DAC. The current divider can be configured to divide the current signal into a plurality of currents. The device can further include a plurality of switches configured to sample the plurality of currents sequentially using the same clock frequency. The device can further include a circuit configured to combine the plurality of sampled currents to generate an output current signal In some examples, a system for implementing multiple and accumulate (MAC) operations is generally described. The system can include a memory comprising a plurality of memory elements. The system can further include a device configured to be in communication with the memory. The device can include a plurality of circuit blocks connected to the plurality of memory elements. A circuit block can include a current mode digital-to-analog converter (DAC) configured to multiply an input digital signal with an input current to generate a current signal. The circuit block can further include a current divider coupled to the current mode DAC, the current divider being configured to divide the current signal into a plurality of currents. The circuit block can further include a plurality of switches configured to sample the plurality of currents sequentially using the same clock frequency. The circuit block can further include a circuit configured to combine the plurality of sampled currents to generate an output current signal. The circuit can be further configured to send the output current signal to a memory element connected to the circuit block.

In some examples, a method for implementing a multiply and accumulate (MAC) operation. The method can include multiplying an input digital signal with an input current to generate a current signal. The method can further include dividing the current signal into a plurality of currents. The method can further include sampling the plurality of currents sequentially using the same clock frequency. The method can further include combining the plurality of sampled currents to generate an output current signal Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 7 illustrates a schematic of an example computer or processing system that may implement a multiply and accumulate using current division and switching in one embodiment.

DETAILED DESCRIPTION

Figure 1:
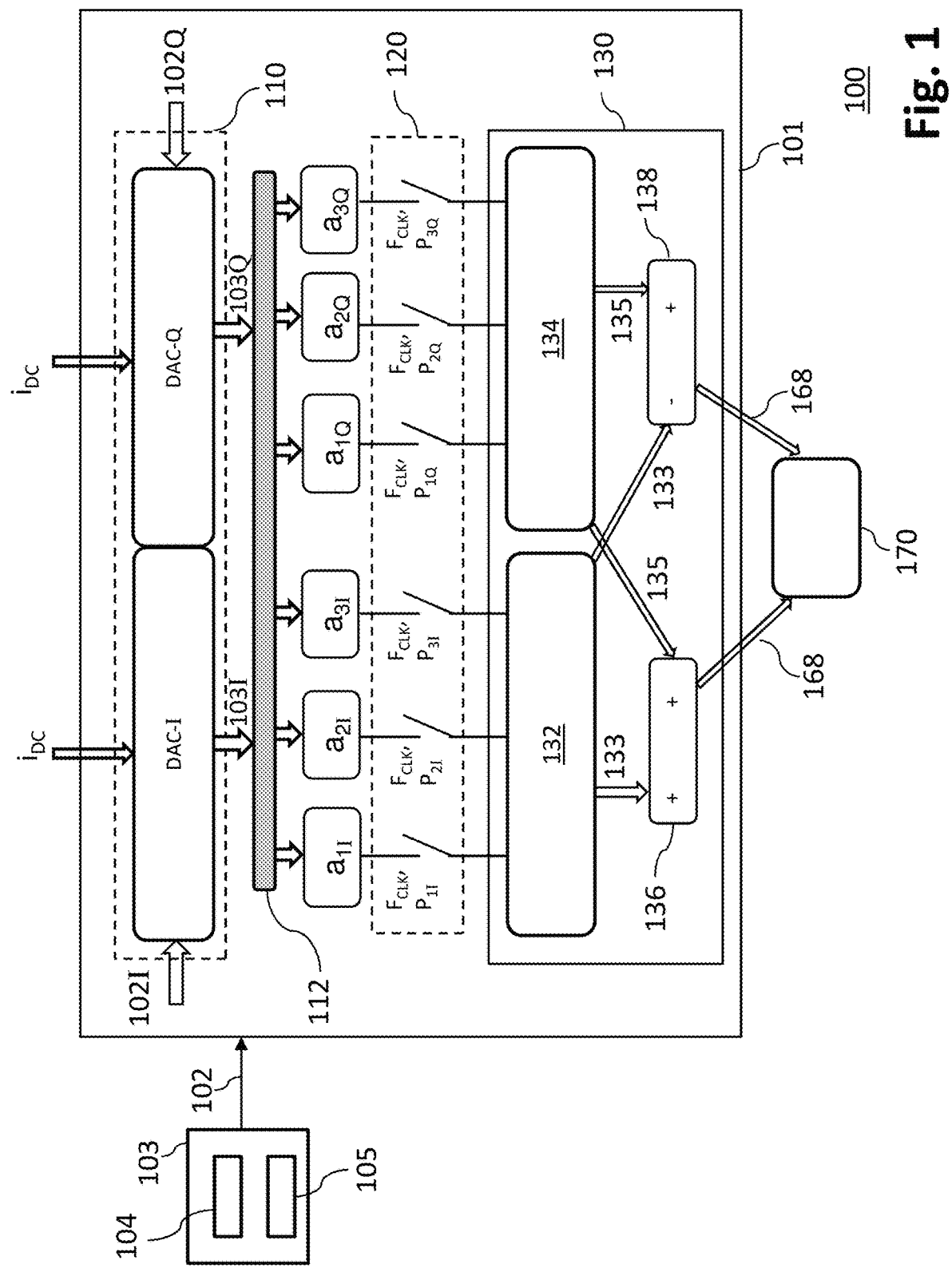
FIG. 1 is a diagram showing an example architecture of a system that can implement multiply and accumulate using current division and switching in one embodiment.

In some examples, hardware systems being used to implement MAC operations can include multiple active stages, such as using voltage mode digital-to-analog converters (DACs) to convert direct current (DC current) to an intermediate frequency (IF frequency) according to an input digital code, using filters (e.g., such as anti-aliasing or reconstruction filters, or baseband filters, etc.) to cure noise and distortions caused by the DAC conversion, and using drivers to perform voltage-to-current conversion for amplification and transmission to other hardware. The conversion performed by voltage mode DACs can be non-linear due to high signal swing, and the voltage-to-current conversion by the driver can also reduce linearity. The non-linear nature of these conversions can cause a reduction in dynamic range by the hardware. The active filters can also utilize a significant amount of power. In some examples, oversampling techniques can reduce filtering, but additional power is required for these oversampling techniques. In other examples, additional layers of filters can be used to perform lower oversampling, but the additional layers can increase device sizes and also increase the number of active stages.

The hardware systems described in accordance with the present disclosure can reduce the number of active stages by utilizing an analog-digital mixed mode architecture. The hardware systems can use a combination of the current mode devices as filters to counter signal distortions, leading to elimination of filters and drivers' usage. The elimination of active filters and drivers can enhance linearity of the hardware system. The elimination of filters and drivers, along with the enhanced linearity, can reduce device size and power consumption by the hardware systems. Further, the current mode devices can be equipped with current dividers and switches to output currents having the same clock frequency but different phases. The output of currents having different phases can accommodate wideband signal processing. Furthermore, hardware systems described in accordance with the present disclosure can provide a direct interface with volatile and/or non-volatile memory devices, such as random-access memory (RAM), static random-access memory (SRAM), dynamic random-access memory (DRAM), magnetoresistive random-access memory (MRAM), resistive random-access memory (ReRAM), phase changing memory (PCM), and/or other types of memories, by sharing current with the memory element itself. Further, in an embodiment, no additional bias current is needed to support the dynamic swing.

In an example, a supply of electrical energy can be regulated under either voltage mode or current mode. Voltage mode can provide a constant output voltage, and current mode can provide a constant current into a variety of load voltage conditions. A voltage source can be used to regulate a supply in voltage mode, and a current source can be used to regulate a supply in current mode. The voltage swing across switching components of a current mode DAC can be minimal, leading to improved linearity. Further, stray capacitance of a current mode DAC may not affect the speed of response of the circuit due to constant ladder node voltages.

FIG. 1 is a diagram showing an example architecture of a system 100 that can implement multiply and accumulate using current division and switching in one embodiment. In the example shown in FIG. 1, the system 100 can include a device 101, a processor 103, and a device 170. The device 101 can be a mixed mode multiply and accumulate unit that can be configured to perform operations in mixed mode, such as multiplying digital signals with analog signals. The device 170 can include one or more components that can receive one or more output signals or current signal 168 from the device 101. For example, the device 170 can be a memory device (e.g., volatile and/or non-volatile), such as SRAM, DRAM, MRAM, resistive random-access memory (ReRAM), phase changing memory (PCM), and/or other types of volatile, non-volatile memory, or memory device. In another example, the device 170 can be a sensor, a device under test (DUT), and/or other types of device. The processor 103 can include a memory 104 and/or a clock generator 105. In examples where the device 170 is a memory device (e.g., MRAM), the device 170 can be a part of the memory 104. The clock generator 105 can be a signal generator configured to generate different clock signals of different frequencies.

The device 101 can include a current mode DAC 110. The DAC 110 can be coupled to a current splitter or divider 112. In some examples, the current divider 112 can be a part of the DAC 110. The DAC 110 can receive an input signal 102 and a constant current denoted as $i_{DC}$ (e.g., direct current (DC) signals). The input signal 102 can be a digital signal. The DAC 110 can include a DAC-I block or circuit and a DAC-Q block or circuit configured to process different components of the current $i_{DC}$, such as the in-phase (I) and quadrature (Q) components of a signal, respectively. The DAC-I block of the DAC 110 can multiply the in-phase input component of 102 (102I) with the input current $i_{DC}$ to generate a current signal 103I, and the DAC-Q block of the DAC 110 can multiply the quadrature input component of 102 (102Q) with the input current $i_{CC}$ to generate a current signal 103Q. The device 101 can operate as a multiply and accumulate (MAC) processor or unit. In examples where the DAC 110 is configured to process both the I and Q components of a signal, the system 100 can be implementing single sideband operations. In examples where the DAC 110 is configured to process one of the I and the Q components of a signal, the system 100 can be implementing double sideband operations.

The current divider 112 can divide or split the current signal 103I into N currents, and can divide or split the current signal 103Q into N currents. In the example shown in FIG. 1, N=3, and the current divider 112 can divide the current signal 103I into three current signals denoted as $a_{1I}$, $a_{2I}$, and $a_{3I}$. The current divider 112 can also divide the current signal 103Q into three current signals denoted as $a_{1Q}$, $a_{2Q}$, $a_{3Q}$. The device 101 can further include a plurality of switches 120. The switches 120 can be configured to sample the current signals $a_{1I}$, $a_{2I}$, and $a_{3I}$ and $a_{1Q}$, $a_{2Q}$, $a_{3Q}$ using the same frequency $F_{CLK}$, and sequentially. For example, the switches 120 can sample the current signal $a_{1I}$ using the frequency $F_{CLK}$ and at a first phase $P_{1I}$, then sample the current signal $a_{2I}$ using the frequency $F_{CLK}$ and at a second phase $P_{2I}$, and sample the current signal $a_{3I}$ using the frequency $F_{CLK}$ and at a third phase $P_{3I}$. Similarly, the switches 120 can sample the current signal $a_{1Q}$ using the frequency $F_{CLK}$ and at the first phase $P_{1I}$, then sample the current signal $a_{2Q}$ using the frequency $F_{CLK}$ and at the second phase $P_{2I}$, and sample the current signal $a_{3Q}$ using the frequency $F_{CLK}$ and at the third phase $P_{3I}$. Note that among the switches 120 for processing the I component current signals, one switch is turned on at a time. Similarly, among the switches 120 for processing the Q component current signals, one switch is turned on at a time. The differences between the first, second, and third phases $P_{1I}$, $P_{2I}$, and $P_{3I}$ can be the same. For example, the first, second, and third phases $P_{1I}$, $P_{2I}$, and $P_{3I}$ can be 0°, 120°, and 240°, respectively. Other examples of the first, second, and third phases $P_{1I}$, $P_{2I}$, and $P_{3I}$ can be 0°, 240°, 480°, or 180°, 60°, 300°.

The device 101 can further include a set of circuits 130 configured to scale and combine the sampled current signals from the switches 120. For example, the set of circuits 130 can include a circuit 132 configured to sum and scale the sampled versions of the I component currents $a_{1I}$, $a_{2I}$, and $a_{3I}$ from the switches 120 to generate a summed current 133. The set of circuits 130 can further include a circuit 134 configured to sum and scale the sampled version of the Q component currents $a_{1Q}$, $a_{2Q}$, $a_{3Q}$ from the switches 120 to generate a summed current 135. In an example, the set of circuits 130 can perform current scaling to provide current with variable amplitude that may be required for read or write operations to memory devices (e.g., device 170). The summed currents 133 and 135 can be combined at a low impedance node 136 and the summed currents 133 and 138 can be combined at a low impedance node 138 to generate the output current signal 168. The output current signal 168 can be provided to the device 170 to facilitate operations of the device 170.

In an example embodiment, the current divider 112 can divide the current signal 103I (or 103Q) such that one of the divided current signals can be relatively larger than the other two divided current signals. For example, $a_{1I}$ can be 98% of the current 103I, or 0.98×103I, and each one of $a_{2I}$ and $a_{3I}$ can be 1% of the current 103I, or 0.01×103I. By sampling $a_{1I}$, $a_{2I}$, $a_{3I}$ sequentially at equal phase differences or intervals (e.g., differences between phases $P_{1I}$, $P_{2I}$, and $P_{3I}$ are the same) and summing the sequentially sampled currents, the relatively smaller currents $a_{2I}$ and $a_{3I}$ can cancel clock spur that may be present in the output current signal 168. The division of the current signals 103I and 103Q can be controlled to accommodate the clock spur cancellation. For example, the current divider 112 can divide the signal 103I such that $a_{1I}$ can be 97% of the current 103I, $a_{2I}$ can be 2% of the current 103I, and $a_{3I}$ can be can be 1% of the current 103I. The flexibility to control the portion size of the divided currents can allow the device 101 to adjust amplitudes of the currents $a_{2I}$ and $a_{3I}$ to counter different amounts of clock spur. Note that any one divided current among currents $a_{1I}$, $a_{2I}$, and $a_{3I}$ can have a portion size that is relatively greater than the other two divided currents.

The output current 168 can be sent to the device 170. In an example where the device 170 can be a MRAM cell or element, the output current 168 can be used to perform reading and writing operations on the MRAM cell. In another example, the device 170 can be an MRAM cell among a plurality or an array (e.g., a crossbar array) of MRAM cells configured to implement an artificial neural network. The bit length L of the input 102 can represent a number of write lines to select particular MRAM cells for writing or reading operations. The DAC 110 can receive analog input, such as current, that represents weights to be written in a write operation. By utilizing the example architecture shown in FIG. 1 to implement artificial neural networks, multiply and accumulate operations can be performed with improved performance such as lower power consumption (due to not using a filter for voltage mode devices) and improved linearity of the signals being processed by the system 100. Also, by using current mode DAC 110, current can be shared between the device 170 and the DAC 110 without additional bias current, and usage of buffers and drivers can be eliminated. The elimination of buffers and drivers can improve linearity of the output current signal 168, and reduce device size.

Figure 2:
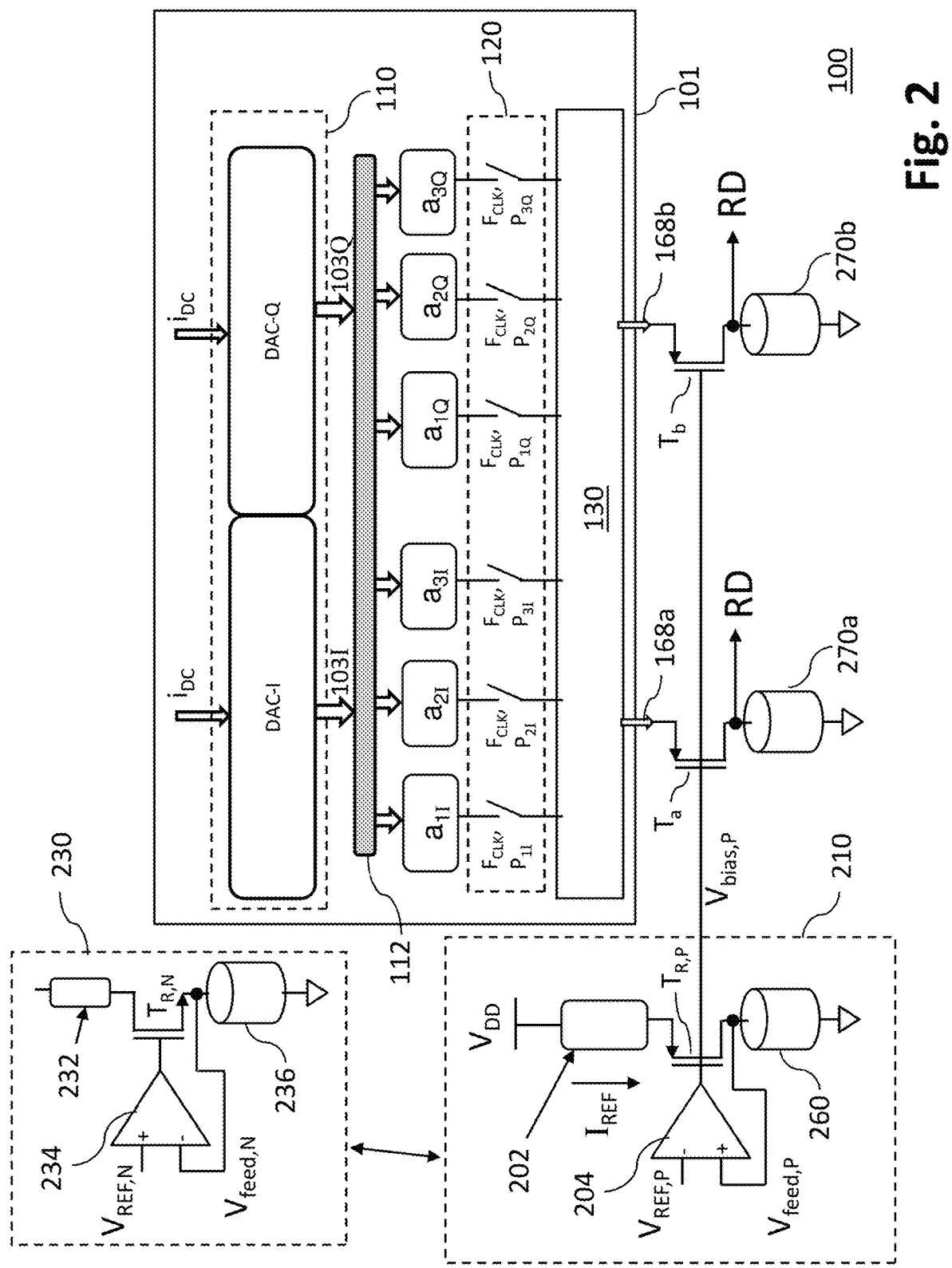
FIG. 2 is a diagram showing an example implementation of multiply and accumulate using current division and switching in one embodiment.

FIG. 2 is a diagram showing an example implementation of multiply and accumulate using current division and switching in one embodiment. In an example shown in FIG. 2, the system 100 can further include a circuit 210 configured to implement a write operation of a memory (e.g., volatile and/or non-volatile memory). The circuit 210 can include a replica circuit 202, an amplifier 204, a transistor $T_{R,P}$, and a memory element 260. The replica circuit 202 can be a replica circuit of the device 101. The amplifier 204 can be an error amplifier with a negative feedback and the transistor $T_{R,P}$ can be a P-type metal-oxide-semiconductor (PMOS) transistor. The memory element 260 can be a magnetic tunnel junction (MTJ) memory element among a non-volatile memory, such as magnetoresistive random-access memory (MRAM), resistive random-access memory (ReRAM), phase changing memory (PCM), and/or other types of non-volatile memory. The circuit 210 can be powered by the same power supply as the device 101 (e.g., $V_{DD}$). The amplifier 204 can be configured to receive a reference voltage $V_{REF,P}$ (e.g., from a voltage generator).

In some examples, the device 101 can be connected to one or more memory elements. In the example shown in FIG. 2, the device 101 can be connected to two memory elements—a memory element 270a via the transistor $T_a$, and a memory element 270b via another transistor $T_b$. The memory elements 270a and 270b can be MTJ memory elements and can share the current with the device 101. The output current signal 168a can be generated by the DAC-I portion of the device 101 (e.g., sampled versions of $a_{1I}$, $a_{2I}$, $a_{3I}$) and can be provided to the memory element 270a to write to the memory element 270a. The output current signal 168b can be generated by the DAC-Q portion of the device 101 (e.g., sampled versions of $a_{1Q}$, $a_{2Q}$, $a_{3Q}$) and can be provided to the memory element 270b to write to the memory element 270b. The amplifier 204 can receive the reference voltage $V_{REF,P}$ and a feedback voltage $V_{feed,P}$ from a point between the transistor $T_{R,P}$ and the memory element 260. The amplifier 204 can output a bias voltage $V_{bias,P}$ to bias the transistors $T_a$ and $T_b$. In an example embodiment, the device 101 can be one circuit block among N circuit blocks, the pair of memory elements 270a, 270b can be one pair of memory elements among N pairs of memory elements, and the pair of transistors $T_a$, $T_b$ can be one pair of transistors among N pairs of transistors. The circuit 210 can provide the bias voltage $V_{bias,P}$ to the N pairs of transistors to bias the N pairs of transistors when the system 100 is being implemented to write to the N memory elements.

In another example embodiment, the system 100 can implement a write operation using another circuit 230 and N-type metal-oxide-semiconductor (NMOS) transistors connected between the device 101 and the memory elements. For example, the circuit 230 can replace the circuit 210 and the transistors $T_a$ and $T_b$ can be NMOS transistors. The circuit 210 can include a replica circuit 232, an amplifier 234, a transistor $T_{R,N}$, and a memory element 236. The replica circuit 232 can be a replica circuit of the device 101. The amplifier 234 can be an error amplifier with a negative feedback and the transistor $T_{R,N}$ can be a NMOS transistor. The memory element 236 can be a magnetic tunnel junction (MTJ) memory element among a magnetoresistive random-access memory (MRAM). The circuit 230 can be powered by the same power supply as the device 101 (e.g., $V_{DD}$). The amplifier 234 can be configured to receive a reference voltage $V_{REF,N}$ (e.g., from a voltage generator). The amplifier 234 can receive the reference voltage $V_{REF,N}$ and a feedback voltage $V_{feed,N}$ from a point between the transistor $T_{R,N}$ and the memory element 236. The amplifier 234 can output a bias voltage to bias the transistors $T_a$ and $T_b$, and to other transistors among the N circuit pairs of transistors described above, when the system 100 is being implemented to write to the N memory elements.

Figure 3:
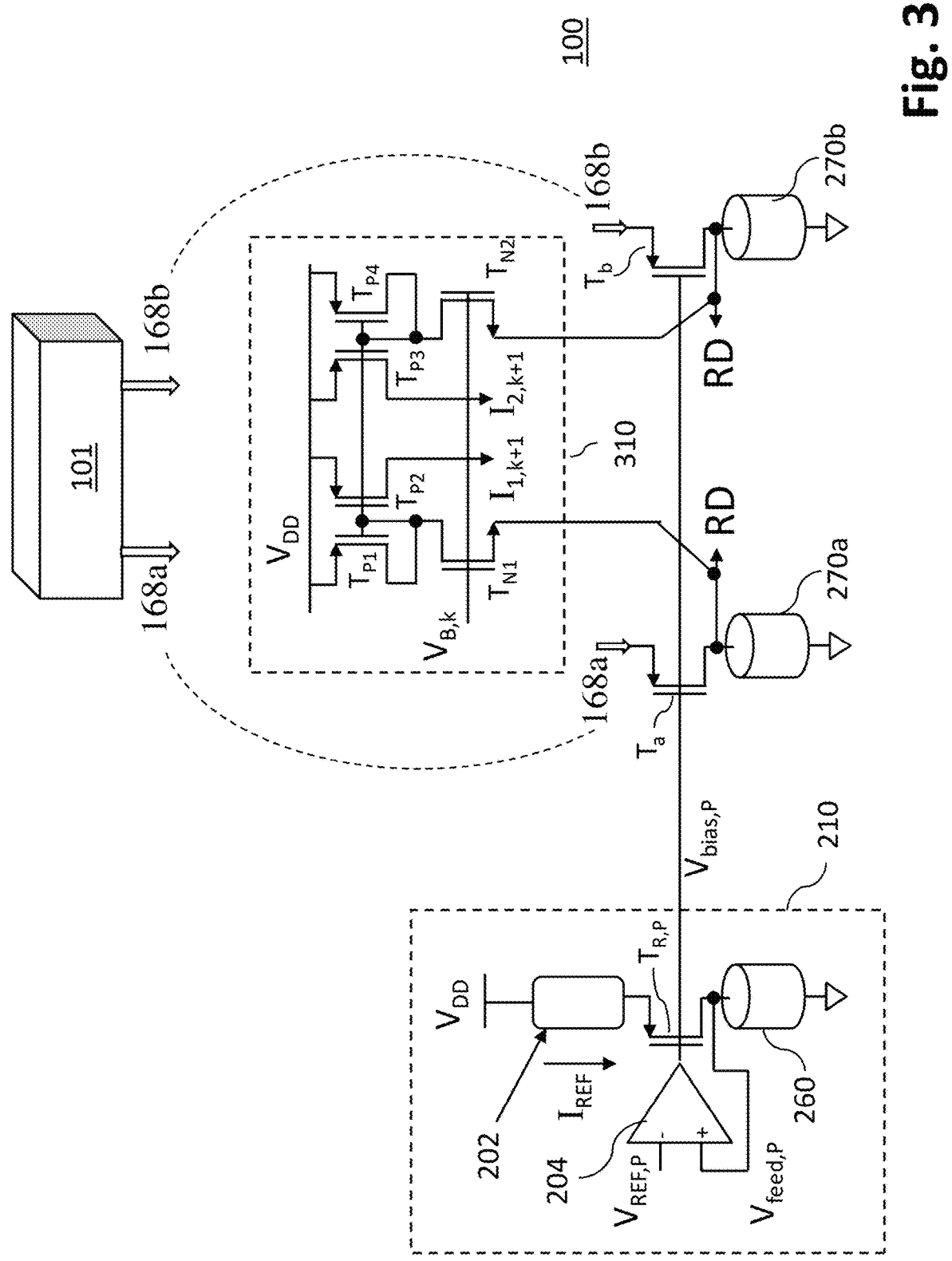
FIG. 3 is a diagram showing another example implementation of multiply and accumulate using current division and switching in one embodiment.

FIG. 3 is a diagram showing another example implementation of multiply and accumulate using current division and switching in one embodiment. In an example shown in FIG. 3, the system 100 can further include a circuit 310 configured to implement a read operation of a non-volatile memory. The circuit 310 can include a plurality of PMOS transistors $T_{P1}$, $T_{P2}$, $T_{P3}$, $T_{P4}$. The circuit 310 can further include a pair of NMOS transistors $T_{N1}$ and $T_{N2}$. The circuit 310 can be powered by the same power supply as the device 101 (e.g., $V_{DD}$).

In an example embodiment, the device 101 can be one circuit block among N circuit blocks, the circuit 310 can be one circuit among N identical circuits, the pair of memory elements 270a, 270b can be one pair of memory elements among N pairs of memory elements. To implement a read operation, the circuit 310 can receive a bias voltage $V_{B,N}$ and use the bias voltage $V_{B,N}$ to bias the NMOS transistors $T_{N1}$ and $T_{N2}$. The bias voltage $V_{B,N}$ can also be provided to the N identical circuits to bias the NMOS transistors within the identical circuits (e.g., circuits identical to circuit 310). Data being stored in the memory elements 270a, 270b can be read out as currents $I_{1,k+1}$ and $I_{2,k+1}$, where the currents $I_{1,k+1}$ and $I_{2,k+1}$ can be sent to a next identical circuit. For example, the circuit 310 shown in FIG. 3 can be a $k^{th}$ circuit, and the data being stored in memory elements 270a, 270b can be read out as currents $I_{1,k+1}$ and $I_{2,k+1}$ and can be transmitted to DACs (e.g., $i_{DC}$ received by DAC-I and DAC-Q shown in FIG. 1) of a $(k+1)^{th}$ instance of device 101. In an example, an instance of the circuit 310 located at (1, k) (e.g., first column and $k^{th}$ row) among an array of M×N (M columns, N rows) can output the data stored at the memory element at (1, k) as current to an instance of the device 101 located at (1, k+1). This row-by-row sequential reading or current sensing can be performed sequentially until data stored in the last memory element of the first column, at (1, N), is read. In an example, the system 100 can perform MAC operations using the current sharing provided by the circuit 310 during read or write operations.

Figure 4:
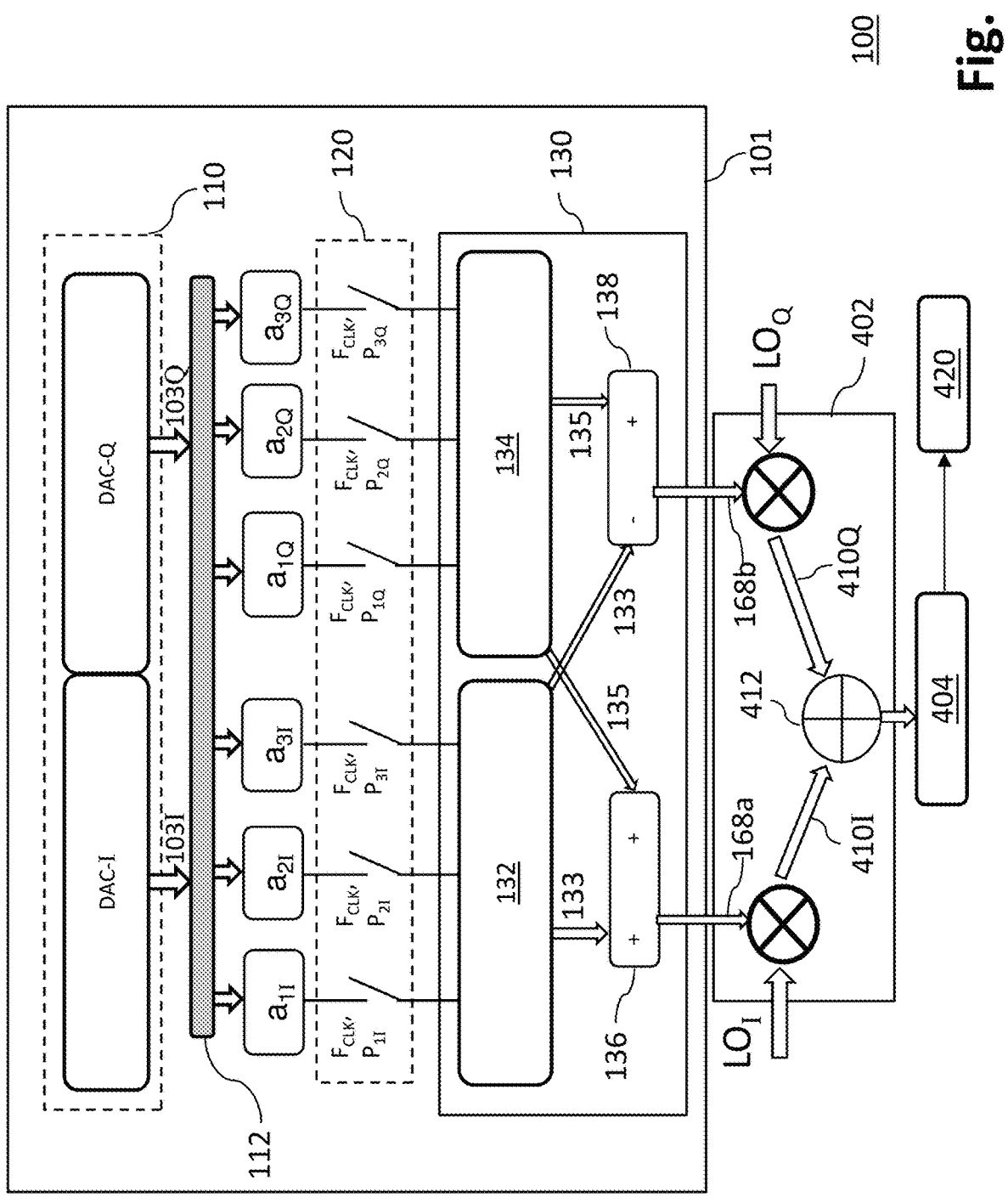
FIG. 4 is a diagram showing an example architecture of a system that can implement multiply and accumulate using current division and switching in one embodiment.

FIG. 4 is a diagram showing another example implementation of multiply and accumulate using current division and switching in one embodiment. In an example shown in FIG. 4, the system 100 can further include a circuit 402, a circuit 404, and a device under test (DUT) 420. The circuit 402 can include at least one mixers configured to multiply the output current signal from the device 101 with local oscillator clock signals. For example, a mixer among the circuit 402 can multiply the output current signal 168a with an I-component of a local oscillator clock signal, labeled as $LO_I$, to generate a heterodyne signal 410I. Another mixer among the circuit 402 can multiply the output current signal 168b with a Q-component of a local oscillator clock signal, labeled as $LO_Q$, to generate a heterodyne signal 410Q. The heterodyne signals 410I and 410Q can be combined at a node 412, and the combined signals can be transmitted to the circuit 404. The circuit 404 can include a transformer and matching network corresponding to the DUT 420.

Figure 5:
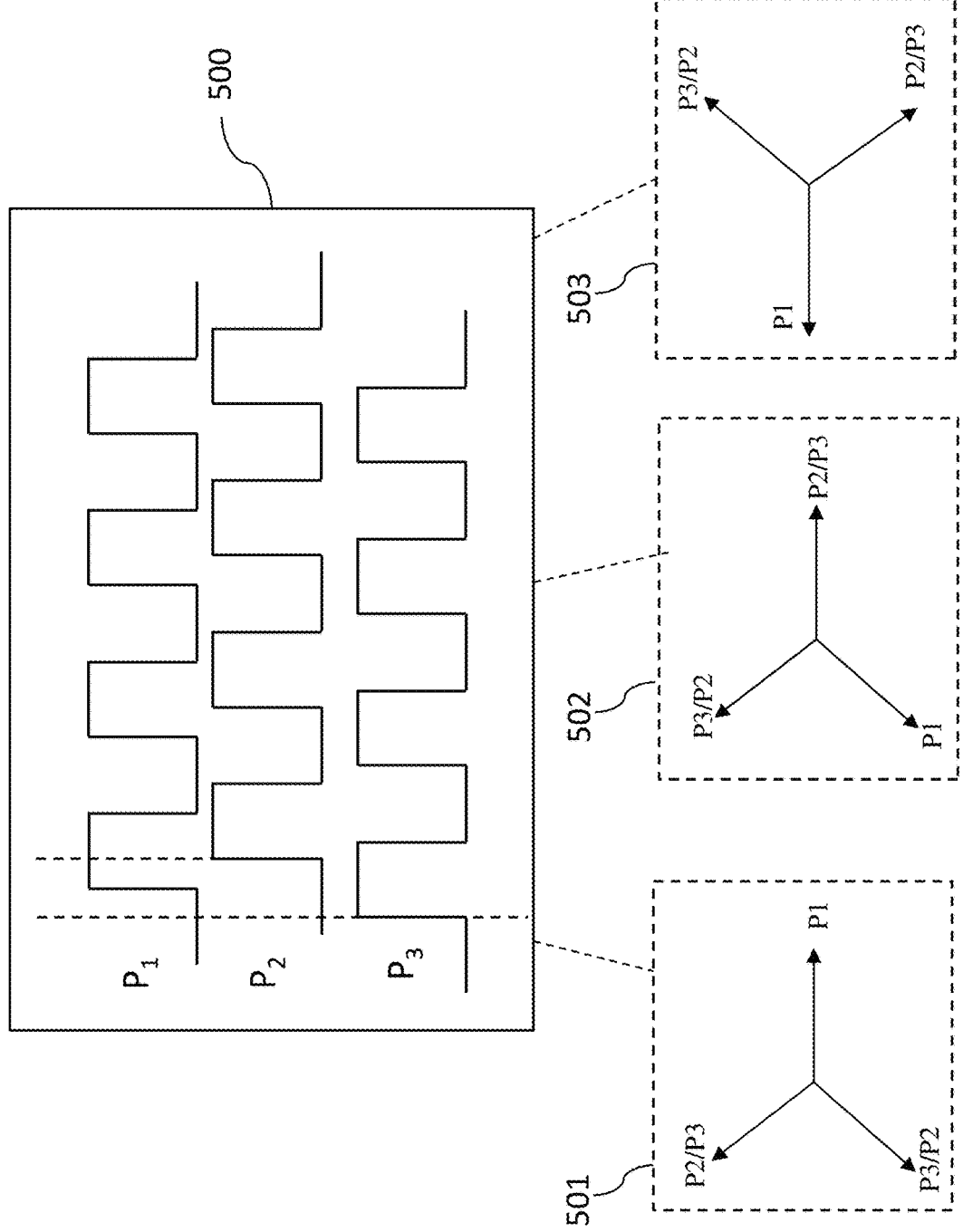
FIG. 5 is a diagram showing a timing diagram relating to an implementation of multiply and accumulate using current division and switching in one embodiment.

FIG. 5 is a diagram showing a timing diagram 500 relating to an implementation of multiply and accumulate using current division and switching in one embodiment. The system described herein (e.g., system 100) can divide or split a current signal (e.g., current signal 103I or 103Q) into, for example, three currents (e.g., $a_{1I}a_{2I}$, $a_{3I}$ or $a_{1Q}$, $a_{2Q}$, $a_{3Q}$). A set of switches (e.g., switches 120) can sample the divided current signals sequentially using the same frequency $F_{CLK}$, at three different phases $P_1$, $P_2$, $P_3$ that can be equally separated from each other. The timing diagram 500 shows an example where the differences between the three phases $P_1$, $P_2$, and $P_3$ are the same at 120°.

Further, a set of example constellations 501, 502, 503 having 120° difference are shown in FIG. 5. The example constellations 501, 502, 503 can be represented by a plurality of phasors P1, P2, P3. The sequence of the phasors P1, P2, P3 can be changed, resulting in a total of the six possible combinations. For example, the example constellation 501 presents two possible combinations: a first combination that starts from the phasor P1 and rotates in the counter-clockwise direction, and a second combination that starts from the phasor P1 and rotates in the clockwise direction. For a 120° phasor difference constellation (e.g., 501, 502, or 503), the first and second clock spur components associated with the fundamental frequency of the clock frequency can cancel out each other in the overall vector system according to the following equations.

Equation at fundamental frequency of the clock of the system 100:

$$\cos(\varphi_{ref}) + \cos(\varphi_{ref}+\varphi) + \cos(\varphi_{ref}+2\varphi) = 0$$

$$\sin(\varphi_{ref}+\varphi) + \sin(\varphi_{ref}+2\varphi) = 0$$

where $\varphi_{ref}=0°/120°/240°$, and y can be the phasor difference, which is 120° in the examples shown in FIG. 5.

Equation at second harmonic of the clock:

$$\cos(2\varphi_{ref}) + \cos(2\varphi_{ref}+2\varphi) + \cos(2\varphi_{ref}+4\varphi) = 0$$

$$\sin(2\varphi_{ref}+2\varphi) + \sin(2\varphi_{ref}+4\varphi) = 0$$

As an example, the three phases $P_1$, $P_2$, and $P_3$ can be 0°, 120°, and 240°, respectively. In the example shown by the timing diagram 500, the phase $P_2$ leads the phase $P_1$ by 120 degrees, and the phase $P_1$ leads the phase $P_3$ by 120 degrees. Note that the vector sum of the spurious terms of the current waveforms of the three phases $P_1$, $P_2$, and $P_3$ is equal to zero at the two frequencies of $F_{clk} \pm F_{sig}$, and $F_{clk} \pm 2*F_{sig}$, where $F_{sig}$ represents the frequency content of a corresponding signal waveform. For example, one of the current signals $a_{1I}$, $a_{2I}$, $a_{3I}$, $a_{1Q}$, $a_{2Q}$, $a_{3Q}$ can be represented by the expression $Y=A[\sin(2\pi*f_1*t)]$ where A denotes the amplitude of the signal Y and $F_{sig}=f_1$. Further, by dividing the current signal into three currents and sampling them at three equal phases, the sampled version of the current signal can be used for other systems or devices that utilize triple phase signals.

Figure 6:
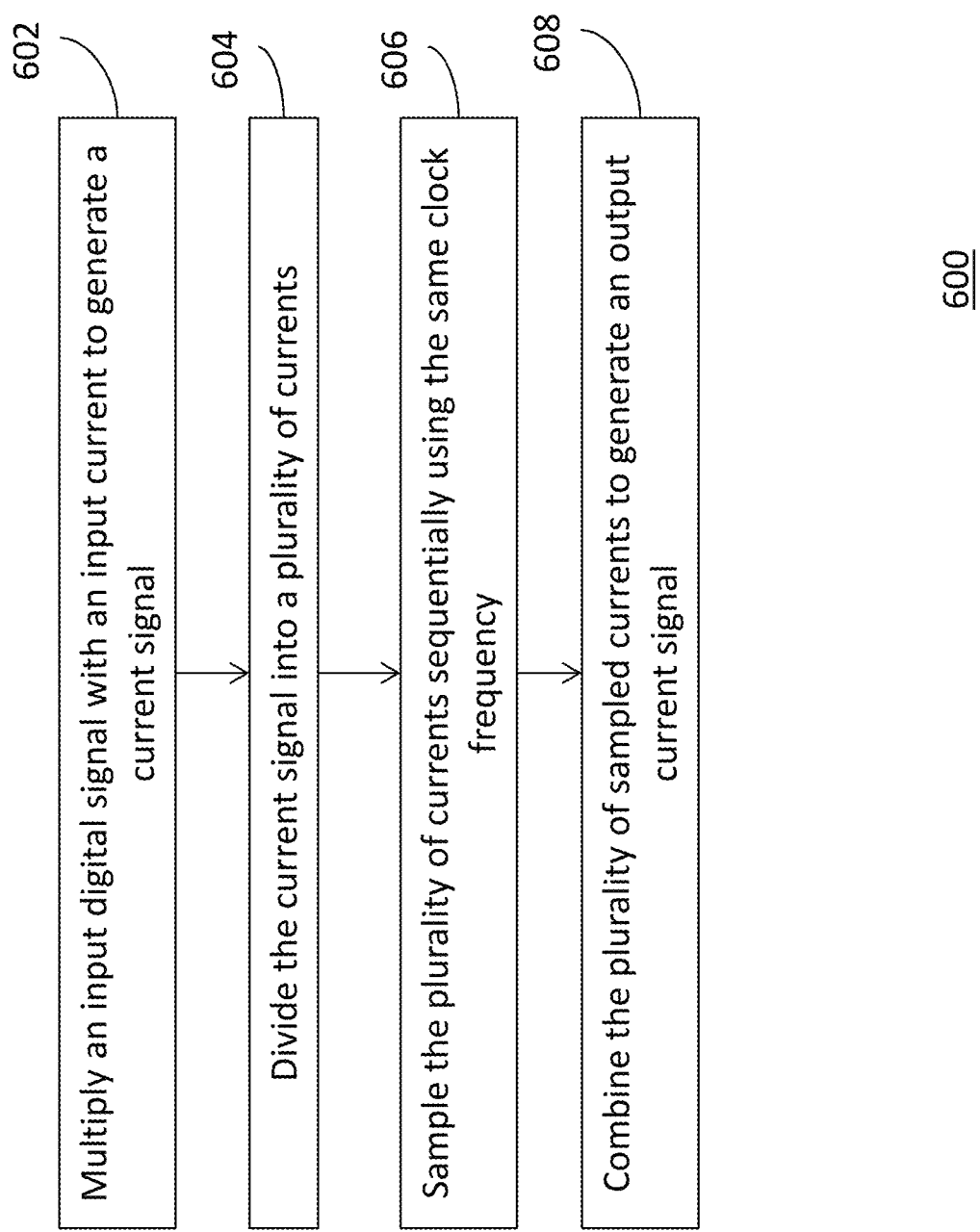
FIG. 6 a flow diagram illustrating a process that can be performed by a system to implement multiply and accumulate using current division and switching in one embodiment.

FIG. 6 a flow diagram illustrating a process that can be performed by a system to implement multiply and accumulate using current division and switching in one embodiment. An example process 600 may include one or more operations, actions, or functions as illustrated by one or more of blocks 602, 604, 606, and/or 608. Although illustrated as discrete blocks, various blocks can be divided into additional blocks, combined into fewer blocks, eliminated, or performed in parallel, depending on the desired implementation.

The process 600 can begin at block 602, where a device can multiply an input digital signal with an input current to generate a current signal. The process 600 can continue from block 602 to block 604. At block 604, the device can divide the current signal into a plurality of currents. In some examples, the plurality of currents can include a first current, a second current, and a third current. The plurality of switches can include a first switch, a second switch, and a third switch. The plurality of currents can be sampled by the plurality of switches, resulting in a first sampled current, a second sampled current, and a third sampled current. A first phase difference between the first sampled current and the second sampled current can be equal to a second phase difference between the second sampled current and the third sampled current.

The process 600 can continue from block 604 to block 606. At block 606, the device can sample the plurality of currents sequentially using the same clock frequency. The process can continue from block 606 to block 608. At block 608, the device can combine the plurality of sampled currents to generate an output current signal. In some examples, the device can send the output current signal to a memory element among a non-volatile memory. The device can implement a write operation of the non-volatile memory by generating a bias voltage and biasing the memory element among the non-volatile memory using the bias voltage. The device can further implement a read operation by outputting data stored in a first memory element of the non-volatile memory as current to a different device connected to a second memory element of the non-volatile memory. In some examples, the device can multiply a local oscillator clock signal with the output current signal to generate a heterodyne signal. The device can send the heterodyne signal to another circuit that includes a transformer and a matching network connected to a device under test.

FIG. 7 illustrates a schematic of an example computer or processing system that can implement multiply and accumulate using current division and switching in one embodiment. The computer system is only one example of a suitable processing system and is not intended to suggest any limitation as to the scope of use or functionality of embodiments of the methodology described herein. The processing system shown can be operational with numerous other general purpose or special purpose computing system environments or configurations. Examples of well-known computing systems, environments, and/or configurations that can be suitable for use with the processing system shown in FIG. 7 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, supercomputers, and distributed cloud computing environments that include any of the above systems or devices, and the like.

The computer system can be described in the general context of computer system executable instructions, such as program modules, being executed by a computer system. Generally, program modules may include routines, programs, objects, components, logic, data structures, and so on that perform particular tasks or implement particular abstract data types. The computer system can be practiced in distributed cloud computing environments where tasks are performed by remote processing devices that are linked through a communications network. In a distributed cloud computing environment, program modules can be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 (e.g., MAC module 30) that performs the methods described herein. The module 30 can be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media can be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention can be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A device comprising:
   a current mode digital-to-analog converter (DAC) configured to multiply an input digital signal with an input current to generate a current signal;
   a current divider coupled to the current mode DAC, the current divider being configured to divide the current signal into a plurality of currents;
   a plurality of switches configured to sample the plurality of currents sequentially using the same clock frequency; and
   a circuit configured to combine the plurality of sampled currents to generate an output current signal.

2. The device of claim 1, wherein:
   the plurality of currents comprises a first current, a second current, and a third current;
   the plurality of switches comprises a first switch, a second switch, and a third switch; and
   the plurality of currents sampled by the plurality of switches comprises a first sampled current, a second sampled current, and a third sampled current.

3. The device of claim 2, wherein a first phase difference between the first sampled current and the second sampled current is equal to a second phase difference between the second sampled current and the third sampled current.

4. The device of claim 1, wherein the circuit is further configured to send the output current signal to a memory element of a memory.

5. The device of claim 4, further comprising a transistor connected between the memory element and the circuit, wherein the transistor is biased using bias voltage generated by a replica of the device to implement a write operation of the memory.

6. The device of claim 4, wherein the memory element is a first memory element of the memory, and the device further comprises another circuit configured to implement a read operation of the memory element, said another circuit being configured to output data stored in the first memory element as current to a different device connected to a second memory element among of the memory.

7. The device of claim 1, further comprises another circuit configured to:
multiply a local oscillator clock signal with the output current signal to generate a heterodyne signal; and
send the heterodyne signal to another circuit comprising a transformer and a matching network connected to a device under test.

8. A system comprising:
a memory comprising a plurality of memory elements;
a device configured to be in communication with the memory, the device comprising a plurality of circuit blocks connected to the plurality of memory elements, a circuit block comprises:
a current mode digital-to-analog converter (DAC) configured to multiply an input digital signal with an input current to generate a current signal;
a current divider coupled to the current mode DAC, the current divider being configured to divide the current signal into a plurality of currents;
a plurality of switches configured to sample the plurality of currents sequentially using the same clock frequency; and
a circuit configured to:
combine the plurality of sampled currents to generate an output current signal; and
send the output current signal to a memory element connected to the circuit block.

9. The system of claim 8, wherein:
the plurality of currents comprises a first current, a second current, and a third current;
the plurality of switches comprises a first switch, a second switch, and a third switch; and
the plurality of currents sampled by the plurality of switches comprises a first sampled current, a second sampled current, and a third sampled current.

10. The system of claim 9, wherein a first phase difference between the first sampled current and the second sampled current is equal to a second phase difference between the second sampled current and the third sampled current.

11. The system of claim 8, wherein the memory is a non-volatile memory.

12. The system of claim 8, wherein the circuit block further comprises a transistor connected between the memory element and the circuit, the transistor is biased using bias voltage generated by a replica of the device to implement a write operation of the memory.

13. The system of claim 8, wherein the memory element is a first memory element of the memory, and the circuit block further comprises another circuit configured to implement a read operation of the memory element, said another circuit being configured to output data stored in the first memory element as current to another circuit block connected to a second memory element among of the memory.

14. A method for implementing a multiply and accumulate (MAC) operation, the method comprising:
multiplying an input digital signal with an input current to generate a current signal;
dividing the current signal into a plurality of currents;
sampling the plurality of currents sequentially using the same clock frequency; and
combining the plurality of sampled currents to generate an output current signal.

15. The method of claim 14, wherein:
the plurality of currents comprises a first current, a second current, and a third current;
the plurality of switches comprises a first switch, a second switch, and a third switch; and
the plurality of currents sampled by the plurality of switches comprises a first sampled current, a second sampled current, and a third sampled current.

16. The method of claim 15, wherein a first phase difference between the first sampled current and the second sampled current is equal to a second phase difference between the second sampled current and the third sampled current.

17. The method of claim 14, further comprising sending the output current signal to a memory element among a memory.

18. The method of claim 17, further comprising implementing a write operation of the memory by:
generating a bias voltage; and
biasing the memory element among the memory using the bias voltage.

19. The method of claim 17, wherein the memory element is a first memory element of the memory, and the method further comprising implementing a read operation by outputting data stored in the first memory element as current to a device connected to a second memory element among of the memory.

20. The method of claim 14, further comprising:
multiplying a local oscillator clock signal with the output current signal to generate a heterodyne signal; and
sending the heterodyne signal to another circuit comprising a transformer and a matching network connected to a device under test.

* * * * *